US007962112B2

United States Patent
Sandner et al.

(10) Patent No.: US 7,962,112 B2
(45) Date of Patent: Jun. 14, 2011

(54) HETERODYNE RECEIVER

(75) Inventors: Harald Sandner, Marzling (DE); Ajaib Hussain, Freising (DE)

(73) Assignee: Texas Instruments Deutschland GmbH, Freising (DE)

(*) Notice: Subject to any disclaimer, the term of this patent is extended or adjusted under 35 U.S.C. 154(b) by 799 days.

(21) Appl. No.: 11/954,136

(22) Filed: Dec. 11, 2007

(65) Prior Publication Data

US 2008/0153445 A1    Jun. 26, 2008

(30) Foreign Application Priority Data

Dec. 12, 2006   (DE) .......................... 10 2006 058 515

(51) Int. Cl.
*H04B 1/06*   (2006.01)
*H04K 3/00*   (2006.01)
(52) U.S. Cl. ................ 455/241.1; 455/245.2; 455/251.1
(58) Field of Classification Search ............... 455/232.1, 455/234.1–235.1, 239.1–241.1, 245.2, 251.1, 455/253.2; 375/345
See application file for complete search history.

(56) References Cited

U.S. PATENT DOCUMENTS

| 5,001,776 A   | * | 3/1991 | Clark   | 455/226.2 |
| 6,718,165 B1  | * | 4/2004 | Ha      | 455/234.2 |
| 2006/0135104 A1 |  | 6/2006 | Lee et al. |  |
| 2009/0163165 A1 | * | 6/2009 | Oomoto | 455/253.2 |

FOREIGN PATENT DOCUMENTS

| EP | 1 241 782 | 9/2002 |
| WO | WO 2006/106503 | 10/2006 |

* cited by examiner

*Primary Examiner* — Lee Nguyen
(74) *Attorney, Agent, or Firm* — John J. Patti; Wade J. Brady, III; Frederick J. Telecky, Jr.

(57) ABSTRACT

A heterodyne receiver comprising a gain controllable RF mixer (14) which has a first input connected to a first local oscillator (16) and a second input connected to an RF input. The receiver comprises a peak detector (38) which detects a peak value of an input signal at the second input of the HF mixer and generates a digital control signal if it is determined that the peak value of the input signal is above a predetermined level. A digital automatic gain control circuit (34) decreases upon reception of the digital control signal the gain of the RF mixer.

15 Claims, 1 Drawing Sheet

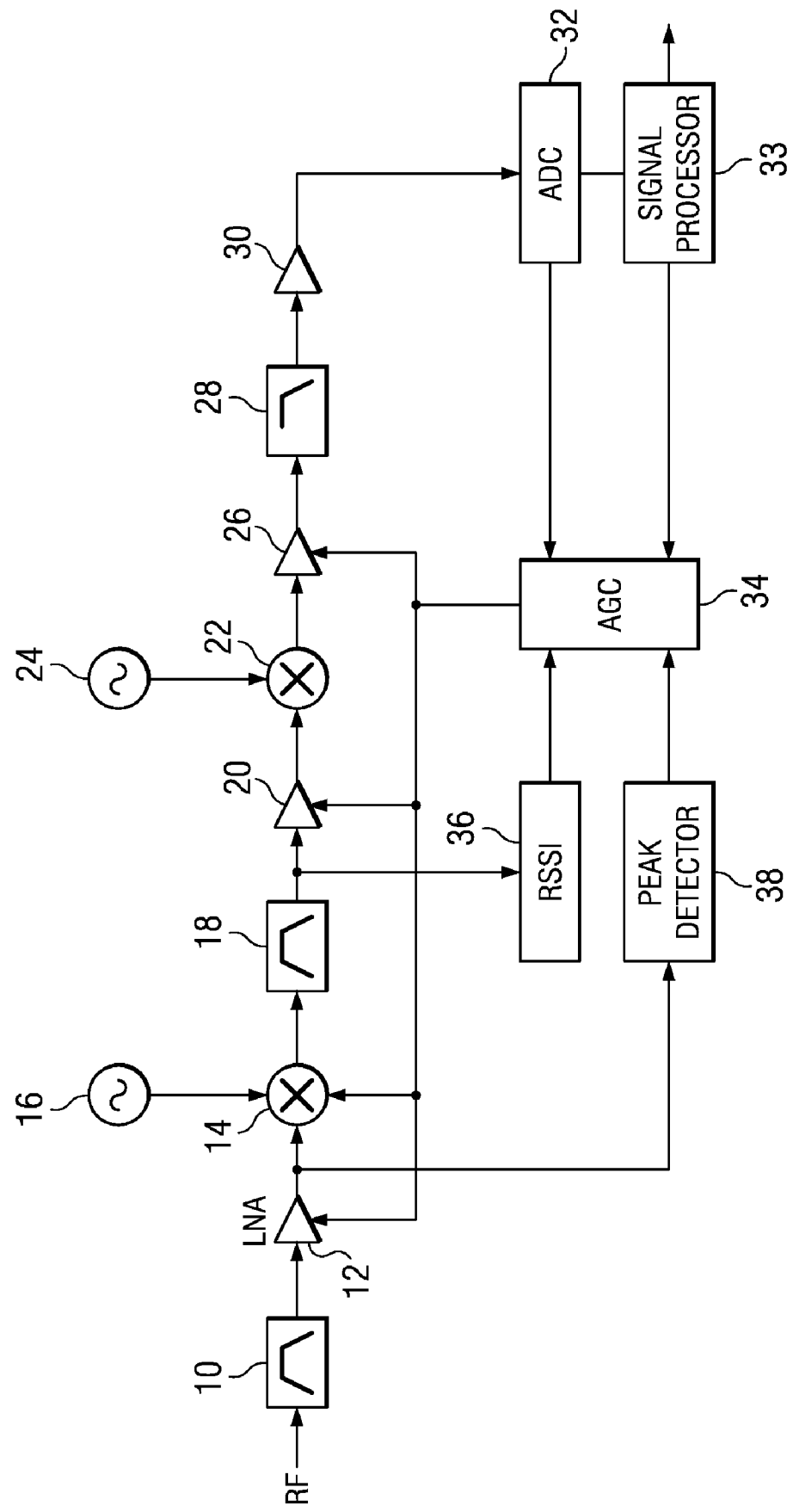

HETERODYNE RECEIVER

This application claims priority from German Patent Application No. 10 006 058515.1 filed 12 Dec. 2006.

FIELD OF THE INVENTION

The invention relates to a heterodyne receiver comprising a gain controllable RF mixer and a digital automatic gain control circuit.

BACKGROUND

In a heterodyne receiver, a broadband RF signal limited by an input band, pass filter is pre-amplified and then down-converted by an RF mixer. Tuning of a heterodyne receiver to a wanted reception frequency is done by changing the frequency of a local oscillator connected to the RF mixer. A narrowband filter connected downstream of the RF mixer filters out the intermediate frequency.

If an active mixer is used, the power of the RF signal input to the RF mixer must stay in the linear zone of the mixer and especially must not become higher than the input compression point. The input compression point depends on the gain of the RF mixer. It is known to detect the signal strength of the intermediate frequency after the narrowband filter and to use an analog control loop to adjust the gain of the pre-amplifier accordingly, thus keeping the signal strength of the RF signal input to the RF mixer in the linear zone. This works well for signal power changes inside the selected frequency band.

A digital audio broadband (DAB) system uses the frequency band III with frequencies comprised between 174 and 240 MHz and the L-band with frequencies between 1452 and 1492 MHz. Especially in the band III, the first and second out-of-band interferer can be up to 50 dB higher than the wanted signal. These interferers are too near to the wanted frequency band to be sufficiently attenuated by the input bandpass filter.

These out-of-band interferers can therefore overload the RF mixer in the heterodyne receiver. An overloaded mixer does not work in its linear zone anymore and the useful signal is not mixed and amplified properly. The interferers cannot be detected by monitoring the signal strength of the intermediate frequency because they are out-of-band.

Overloading of the RF mixer by out-of-band interferers can be prevented by placing a higher order bandpass filter in front of the RF mixer, but this is very expensive.

SUMMARY

The invention provides a heterodyne receiver in which the HF mixer is protected against overload by an interferer.

In one concept, the heterodyne receiver comprises a gain controllable RF mixer, having a first input connected to a first local oscillator and a second input connected to an RF input. It further comprises a digital automatic gain control circuit which, upon reception of a digital control signal, decreases the gain of the RF mixer. The receiver further comprises a peak detector which detects a peak in an HF input signal at the second input of the RF mixer and generates the digital control signal if it is determined that the value of the peak is above a predetermined level.

As the detection is effectuated at the second input of the RF mixer and thus downstream of the input bandpass filter and downstream of the pre-amplifier, only interference signals which are input to the mixer are detected. As the detector can determine the value of the peak and compare it to a predetermined level, only interferers that are susceptible to overload the mixer lead to the generation of a digital control signal. Upon reception of the digital control signal, the digital automatic gain control circuit decreases the gain of the RF mixer. Decreasing the gain increases the input compression point. Therefore, the interference signal, which is still input to the RF mixer, cannot overload the RF mixer anymore.

In a described embodiment, a narrowband filter is connected to an output of the RF mixer and a gain controllable amplifier is connected to an output of the narrowband amplifier. The narrowband filter is designed to pass only the intermediate frequency. Upon reception of the digital control signal which decreases the gain of the RF mixer, the gain of the gain-controllable amplifier is increased thus compensating the decrease of gain of the RF mixer. Thereby, the signal level at the output of the receiving chain is kept constant.

In a further embodiment, a second mixer which is an IF mixer is provided in the receiver, having a first input connected to a second local oscillator and a second input connected to an output of the gain controllable amplifier. A programmable gain amplifier is connected to an output of the RF mixer. Upon reception of the digital control signal, the digital automatic gain control circuit increases the gain of the gain-controllable amplifier and/or the gain of the programmable gain amplifier to compensate for the decrease of gain of the RF mixer.

In the described embodiment, the receiver is a COFDM (coded orthogonal frequency division multiplex) receiver and the digital automatic gain control circuit is configured to effectuate any gain changes during the guard interval of the COFDM signal. COFDM is for example used in the digital audio broad band system. In one DAB channel there are a large number of frequency carriers on which the information is transported digitally encoded. As there are many carriers used in parallel, the data rate on each carrier can be kept low. COFDM thus uses many slowly modulated narrowband signals. The information on the carriers is transported in so-called symbols, whereby one symbol can include a plurality of bits. The coded orthogonal frequency division multiplexing differs from orthogonal frequency division multiplexing in that a guard interval is inserted between the OFDM symbols. The guard interval does not contain any information but helps to eliminate intersymbol interferences. When the gain changes and the settling of the RF mixer and the other amplifying stages is done during the guard interval, the signal power in the symbol is not corrupted. Otherwise, the gain change could lead to a misinterpretation of a symbol.

Other details of example embodiments are given below.

BRIEF DESCRIPTION OF THE DRAWINGS

The new architecture and the benefits of the heterodyne receiver will be apparent from the following detailed description of example embodiments, with reference to the appended drawing, which is a schematic diagram of a part of an embodiment of the inventive heterodyne receiver.

DETAILED DESCRIPTION OF EXAMPLE EMBODIMENTS

With reference to the FIGURE, a heterodyne receiver operable to receive signals in the digital audio broadcast (DAB) frequency range comprises an input bandpass filter 10 and a low noise amplifier (LNA) 12. Input bandpass filter 10 is designed with a pass band for the whole frequency band III. The RF signal is then amplified by the LNA 12. A gain-controllable RF mixer 14 has a first input connected to a local oscillator 16 and a second input connected to the output of the low noise amplifier 12. Local oscillator 16 is a voltage controlled oscillator, tuned according to the channel frequency selected out of the band III frequencies. An output of RF mixer 14 is connected to a narrowband filter 18 which filters out the intermediate frequency IM, which is equal to the difference between the frequency of the chosen channel and the local oscillator frequency. The intermediate frequency IM is always constant. Preferably, narrowband filter 18 is a surface acoustic wave (SAW) filter. An output of narrowband filter 18 is connected to a gain-controllable amplifier 20. Gain-controllable amplifier 20 amplifies the signal at the intermediate frequency IM and outputs the amplified signal to an IF mixer 22. The IF mixer 22 has a first input connected to a second local oscillator 24. The output of IF mixer 22 is connected to a programmable gain amplifier 26. IF mixer 22 further down-converts the interference frequency IM.

In the embodiment shown, the frequency of local oscillator 16 is tuned between 212 to 279 MHz, whereas the frequency of local oscillator 24 is a fixed frequency at 40.96 MHz. Thus, the intermediate frequency IM is 38.912 MHz and the frequency output from IF mixer 22 is 2.048 MHz. The output from programmable gain amplifier 26 is input to a low-pass filter 28. The output of the low-pass filter 28 is then connected to a buffer 30, which is connected to an analog-to-digital converter (ADC) 32. The output of ADC 32 is connected to a signal processing unit 33 which processes the demodulated signal further and detects the beginning and the end of guard and symbol intervals contained in a COFDM signal. The signal strength of the intermediate frequency signal output from bandpass filter 18 is detected by a received signal strength indicator (RSSI) 36. A peak detector 38 is connected with its input to the second input of the RF mixer 14, to detect peaks in the RF input signal after amplification by the low noise amplifier 12. The receiver further comprises a digital automatic gain control (AGC) circuit 34. The automatic gain control circuit receives four inputs: a first input is connected to an output of the received signal strength indicator 36, a second input is connected to an output of the peak detector 38, a third input is connected to an output of the analog-to-digital converter 32, and a fourth input is connected to the signal processing unit 33. The automatic gain controller has an output connected to the low noise amplifier 12, to the gain controllable RF mixer 14, to the gain controllable amplifier 20 and to the programmable gain amplifier 26.

In operation, RF mixer 14 is protected from overload by an interferer, because the peak detector 38 detects any peaks in the amplified RF input signal. If the signal level of a detected peak is above a predetermined value, which is dependent on the implementation of the RF mixer, peak detector 38 generates a digital signal which is output to the digital automatic gain control circuit. In a preferred embodiment of a DAB receiver, the predetermined value is set to 34 dBm, but other values are also possible. Upon reception of the digital control signal, the digital automatic gain control circuit 34 decreases the gain of the RF mixer according to the digital control signal by a predefined step. In a preferred embodiment of a DAB receiver, the gain of the RF mixer 14 is decreased by 20 dB. It will be evident to those skilled in the art that other values may be used depending on the overall configuration. Depending on the digital control signal received, digital automatic gain control circuit 34 increases the gain of the gain controllable amplifier 20 and/or increases the gain of the programmable gain amplifier 26. Thus, the gain decrease of the RF mixer is compensated so that the signal level at the output of the receiving chain is kept constant.

Additionally, the digital automatic gain control circuit changes the gain of LNA 12 in a known manner, depending on the detected signal strength of the intermediate frequency, by processing the input received by the received signal strength indicator 36.

The digital automatic gain control circuit further receives a control signal indicating the start and the end of a guard interval from the signal processing unit 33 and effectuates the gain changes during the guard interval, thereby ensuring that the signal power in the symbols is not corrupted.

What is claimed is:

1. A heterodyne receiver comprising:
a first local oscillator;
a second local oscillator;
a gain-controllable radio frequency (RF) mixer that is coupled to the first local oscillator and that receives an RF input signal;
a peak detector that receives the RF input signal, wherein the peak detector detects a peak in the RF input signal and indicates whether the peak is greater than a predetermined level;
a digital automatic gain control circuit that is coupled to the peak detector and the RF mixer, wherein digital automatic gain control circuit the decreases the gain of the RF mixer if the peak is greater than the predetermined level;
an intermediate frequency (IF) mixer that is coupled to the second local oscillator and the RF mixer; and
an amplifier that is coupled to the IF mixer and the digital automatic gain control circuit, wherein the digital automatic gain control circuit is configured to increase the gain of the amplifier if the peak is greater than the predetermined level.

2. The receiver of claim 1, wherein the gain of the RF mixer is decreased by 20 dB and wherein the peak detector generates a digital control signal when the value of the peak is above −34 dBm.

3. The receiver of claim 1, wherein the amplifier further comprises a first amplifier, and wherein the receiver further comprises:
a narrowband filter that is coupled to the RF mixer; and
a second amplifier that is coupled between the narrowband filter and the IF mixer, wherein the digital automatic gain control circuit increases the gain of at least one of the first and second amplifiers if the peak is greater than the predetermined level.

4. The receiver of claim 1, wherein the receiver is a coded orthogonal frequency division multiplex (COFDM) receiver and the digital automatic gain control circuit is configured to effectuate any gain changes during a guard interval of the COFDM signal.

5. The receiver of any of claim 4, wherein the receiver is a digital audio broadband (DAB) receiver.

6. The receiver of claim 5, wherein the receiver is a DAB receiver for frequency band III.

7. A method comprising:
receiving a RF input signal and a first local oscillator signal by a gain-controllable RF mixer;
detecting a peak in the RF input signal;
generating a digital control signal for a digital automatic gain control circuit that indicates whether the peak is greater than a predetermined level;
decreasing the gain of the RF mixer by the digital automatic gain control circuit if the peak is greater than the predetermined level;
amplifying an output from the RF mixer to generate a first amplified signal;

receiving the first amplified signal and a second local oscillator signal by an IF mixer;

amplifying an output of the IF mixer to generate a second amplified signal; and increasing the gain for at least one of the first and second amplified signals if the peak is greater than the predetermined level.

8. The method of claim 7, wherein the gain of the RF mixer is decreased by 20 dB and wherein the peak detector generates a digital control signal when the value of the peak is above −34 dBm.

9. The method of claim 7, wherein the method further comprises filtering an output of the RF mixer before the step of amplifying the output from the RF mixer.

10. An apparatus comprising:

a local oscillator circuit that generates first and second local oscillator signals;

a gain-controllable RF mixer that is coupled to the local oscillator circuit so as to receive the first local oscillator signal and that receives an RF signal, wherein the RF mixer has a first gain;

a first low noise amplifier (LNA) that is coupled to the RF mixer, wherein the first LNA has a second gain;

an IF mixer that is coupled to the local oscillator circuit so as to receive the second local oscillator signal and that is coupled to the first LNA;

a second LNA that is coupled to the IF mixer, wherein the second LNA has a third gain;

a peak detector that receives the RF signal, wherein the peak detector indicates whether a peak of the RF signal is greater than a predetermined level; and an automatic gain controller that is coupled to the peak detector, the first LNA, the second LNA, and the RF mixer, wherein the automatic gain controller decreases the first gain by a predetermined amount if the peak of the RF signal is greater than the predetermined level, and wherein the automatic gain controller increases at least one of the second and third gains if the peak of the RF signal is greater than the predetermined level.

11. The apparatus of claim 10, wherein the apparatus further comprises a narrowband filter that is coupled between the RF mixer and the first LNA.

12. The apparatus of claim 11, wherein the apparatus further comprises:

a low pass filter that is coupled to the second amplifier; and a buffer that is coupled to the low pass filter.

13. The apparatus of claim 12, wherein the apparatus further comprises:

an analog-to-digital converter (ADC) that is coupled to the buffer and the automatic gain controller; and a signal processor that is couple to the ADC and the automatic gain controller.

14. The apparatus of claim 13, wherein the apparatus further comprises an received signal strength indicator (RSSI) that is coupled between the narrowband filter and the automatic gain controller.

15. The apparatus of claim 14, wherein the local oscillator circuit further comprises:

a first local oscillator that generates the first local oscillator signal; and a second local oscillator that generates the second local oscillator signal.

* * * * *